(12) United States Patent
Takeda et al.

(10) Patent No.: US 7,501,223 B2
(45) Date of Patent: Mar. 10, 2009

(54) POLYMER, RESIST COMPOSITION AND PATTERNING PROCESS USING THE SAME

(75) Inventors: Takanobu Takeda, Niigata (JP); Osamu Watanabe, Niigata (JP); Satoshi Watanabe, Niigata (JP); Ryuji Koitabashi, Niigata (JP); Keiichi Masunaga, Niigata (JP); Tamotsu Watanabe, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 11/902,760

(22) Filed: Sep. 25, 2007

(65) Prior Publication Data

US 2008/0090179 A1    Apr. 17, 2008

(30) Foreign Application Priority Data

Oct. 13, 2006  (JP) .............................. 2006-280180

(51) Int. Cl.
  *G03F 7/004*   (2006.01)
  *G03F 7/30*    (2006.01)

(52) U.S. Cl. ............... 430/270.1; 430/326; 430/330; 430/905; 525/333.3

(58) Field of Classification Search ........... 430/270.1, 430/326, 330, 905; 525/333.3
See application file for complete search history.

(56) References Cited

U.S. PATENT DOCUMENTS

| 4,491,628 | A |   | 1/1985 | Ito et al. |
| 4,603,101 | A |   | 7/1986 | Crivello |
| 6,143,460 | A | * | 11/2000 | Kobayashi et al. ......... 430/170 |
| 6,656,660 | B1 | * | 12/2003 | Urano et al. ............. 430/270.1 |

FOREIGN PATENT DOCUMENTS

| EP | A2 0 249 139 | 12/1987 |
| JP | A-62-115440 | 5/1987 |
| JP | A-63-27829 | 2/1988 |
| JP | B2-02-27660 | 6/1990 |
| JP | A-03-223858 | 10/1991 |
| JP | A-03-275149 | 12/1991 |
| JP | A-04-211258 | 8/1992 |
| JP | A-06-100488 | 4/1994 |
| JP | A-06-289608 | 10/1994 |

* cited by examiner

*Primary Examiner*—John S Chu
(74) *Attorney, Agent, or Firm*—Oliff & Berridge, PLC (57) ABSTRACT

There is disclosed a polymer at least comprising repeating units represented by the following general formulae (1) and (2), and the polymer having a mass average molecular weight of 1,000 to 500,000. There can be provided a polymer, and a resist composition, in particular, a chemically amplified positive resist composition that exhibit higher resolution than conventional positive resist compositions, good in-plane dimension uniformity of developed resist patterns on substrates such as mask blanks and high etching resistance.

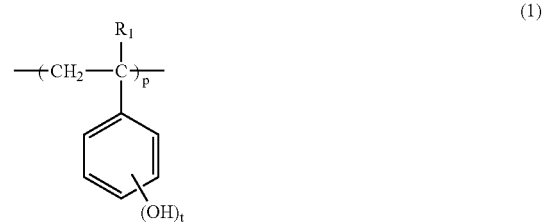

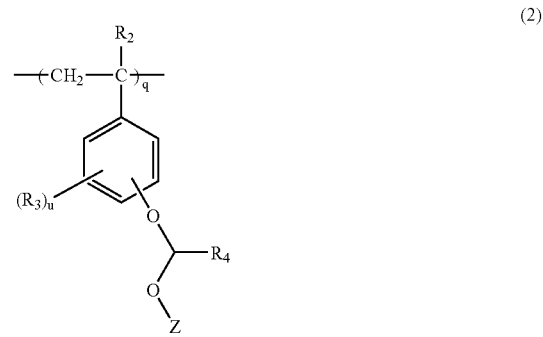

23 Claims, 1 Drawing Sheet

Fig.1

POLYMER, RESIST COMPOSITION AND PATTERNING PROCESS USING THE SAME

BACKGROUND OF THE INVENTION

1. Field of the Invention

The present invention relates to a polymer, and a resist composition, in particular, a chemically amplified positive resist composition that exhibit high resolution, good in-plane dimension uniformity of developed resist patterns on substrates such as mask blanks and excellent etching resistance, and that are suitable as micro patterning compositions, in particular, for fabricating VLSIs or photomasks.

2. Description of the Related Art

In recent years, a finer pattern rule is demanded as high integration and high-speed of LSIs have been realized. Under the circumstances, deep-ultraviolet lithography is considered promising as a next generation microprocessing technique. The deep-ultraviolet lithography allows for processing equal to or less than 0.5 μm. Use of a resist composition having a low optical absorbance in the deep-ultraviolet lithography allows for patterns with wall profiles almost vertical to substrates.

A chemically amplified positive resist composition (For example, see Japanese Examined Patent Application Publication No. 02-27660; and Japanese Unexamined Patent Application Publication No. 63-27829) using an acid as a catalyst has been developed in recent years. The chemically amplified positive resist composition exhibits high sensitivity, high resolution, and high dry etching resistance by using a high-intensity KrF excimer laser as a deep ultra-violet light source. Therefore, the chemically amplified positive resist composition is expected as a promising resist composition for deep-ultraviolet lithography having excellent features.

As for such a chemically amplified positive resist composition, there are known a two-component system composed of a base polymer and an acid generator; and a three-component system composed of a base polymer, an acid generator, and a dissolution inhibitor having an acid labile group.

For example, Japanese Unexamined Patent Application Publication No. 62-115440 suggests a resist composition composed of poly-p-tert-butoxystyrene and an acid generator. Similar to this suggestion, Japanese Unexamined Patent Application Publication No. 03-223858 suggests a two-component system resist composition composed of a resin having a tert-butoxy group intramolecularly and an acid generator. Furthermore, Japanese Unexamined Patent Application Publication No. 04-211258 suggests a two-component system resist composition composed of polyhydroxystyrene having a methyl group, an isopropyl group, a tert-butyl group, a tetrahydropyranyl group, or a trimethylsilyl group and an acid generator.

In addition, Japanese Unexamined Patent Application Publication No. 06-100488 suggests a resist composition composed of a polyhydroxystyrene derivative such as poly[3,4-bis(2-tetrahydropyranyloxy)styrene], poly[3,4-bis(tert-butoxycarbonyloxy)styrenel], or poly[3,5-bis(2tetrahydropyranyloxy)styrene] and an acid generator.

However, when a base resin has a tert-butyl group as an acid labile group, the resist composition has a high baking optimum temperature of about 130° C. When a base resin has a tert-butoxycarbonyl group as an acid labile group, the resist composition exhibits low resolution. In both cases, the resist compositions tend to provide T-top pattern profiles. On the other hand, an alkoxyalkyl group such as an ethoxyethyl group or a 2-tetrahydropyranyl group is decomposed by a weak acid. Therefore, a resist composition with a base resin having an alkoxyalkyl group as an acid labile group has a drawback in which the pattern profile thins considerably as time passes from exposure to a heat treatment. Furthermore, such a resist composition is not compatible with use of a resist film with thinner thickness resulting from reductions in size. In addition, the resist composition lacks heat resistance and causes contamination of the lens of an exposure system by outgassing from resist upon development. Therefore, at present, every resist composition has problems and not compatible with reductions in size.

There is reported another resist composition containing a copolymer of hydroxystyrene and a tertiary (meth)acrylate for the purpose of realizing higher transparency and higher adhesion to a substrate, ameliorating footing profile to a substrate, and enhancing etching resistance (see Japanese Unexamined Patent Application Publications No. 03-275149 and No. 06-289608. However, such a resist composition has problems of insufficient heat resistance, providing poor pattern profiles after development, and the like. Therefore, the resist composition is not satisfactory. In addition, the resist composition provides poor in-plane dimension uniformity of developed resist patterns on substrates such as mask blanks, which becomes more of a problem as pattern line width is reduced in size.

At present, as higher resolution is achieved, thinner patterns are used concurrently. Under the circumstances, there is a demand for a resist composition that exhibits good in-plane dimension uniformity of developed resist patterns on substrates such as mask blanks and high etching resistance.

SUMMARY OF THE INVENTION

The present invention has been accomplished to solve the above-mentioned problems, and an object of the present invention is to provide a polymer used for a resist composition, and a resist composition, in particular, a chemically amplified positive resist composition that exhibit higher resolution than conventional positive resist compositions, good in-plane dimension uniformity of developed resist patterns on substrates such as mask blanks and high etching resistance.

In order to achieve the above object, the present invention provides a polymer at least comprising repeating units represented by the following general formulae (1) and (2), and the polymer having a mass average molecular weight of 1,000 to 500,000, wherein $R_1$ and $R_2$ independently represent a hydrogen atom or a methyl group;

$R_3$ represents any one of a hydroxy group, a linear or branched alkyl group, a halogen atom, and a trifluoromethyl group;

$R_4$ represents a hydrogen atom or a $C_{1-10}$ linear, branched or cyclic alkyl group;

Z represents a $C_{7-30}$ aliphatic polycyclic alkyl group;

t is a positive integer of from 1 to 5;

u is 0 or a positive integer of from 1 to 4; and p and q are positive numbers.

In this case, the polymer preferably further comprises a repeating unit represented by the following formula (3), (3)

wherein r is a positive number.

The polymer preferably further comprises a repeating unit represented by the following formula (4), (4)

wherein s is a positive number.

In the polymers, the Z, which represents a $C_{7-30}$ aliphatic polycyclic alkyl group, is preferably represented by any one of the following formulae (5), (6) and (7).

(5)

(6)

(7)

Such polymers are suitable as base resins for resist compositions, in particular, chemically amplified positive resist compositions. The polymers exhibit high resolution, good in-plane dimension uniformity of developed resist patterns on substrates such as mask blanks and excellent etching resistance. Therefore, the polymers can be used as micro patterning compositions, in particular, for fabricating VLSIs or photomasks.

Each of the polymers preferably has a CLogP value not less than 2.9. The CLogP value is a calculated value of a hydrophobic parameter. More preferably, each of the polymers has a CLogP value not less than 3.0.

When each of the polymers has a CLogP value, a calculated value of a hydrophobic parameter, not less than 2.9, in particular, not less than 3.0, resist compositions comprising the polymers exhibit better in-plane dimension uniformity of developed resist patterns on substrates such as mask blanks.

The present invention also provides a resist composition at least comprising any one of the above polymers.

A resist composition at least comprising any one of the above polymers exhibits high resolution, good in-plane dimension uniformity of developed resist patterns on substrates such as mask blanks and excellent etching resistance. Therefore, such a resist composition can be used as micro patterning compositions, in particular, for fabricating VLSIs or photomasks.

The present invention also provides a chemically amplified positive resist composition at least comprising an organic solvent, any one of the above polymers as a base resin, and an acid generator.

In this way, a resist composition comprising any one of the polymers as a base resin can be used as a chemically amplified positive resist composition that provides patterns with even higher resolution by using an aliphatic polycyclic alkyl group of the polymers as an acetal type reactive group of hydroxystyrene wherein the aliphatic polycyclic alkyl group is decomposed by the action of an acid, thereby increasing the solubility of the polymers to alkaline solutions.

The chemically amplified positive resist composition preferably further comprises a surfactant.

By adding a surfactant, application properties of the resist composition can be further enhanced or controlled.

The chemically amplified positive resist composition preferably further comprises a basic compound.

By adding a basic compound, an acid-diffusion rate in a resist film can be reduced, thereby further enhancing resolution.

The resist composition according to the present invention can be used in a process for patterning semiconductor substrates, mask blanks and the like by at least conducting a step of applying any one of the resist compositions on a substrate; a step of conducting a heat-treatment and then exposing the substrate to a high energy beam; and a step of developing the substrate with a developer.

In this patterning process, it is obvious that the development may be conducted after the exposure and a subsequent heat treatment. Furthermore, other various processes such as an etching process, a resist stripping process or a cleaning process may be conducted. Examples of the high energy beam may include EUV light or an electron beam.

As described above, the present invention provides a polymer suitable as a base resin for a resist composition, in particular, a chemically amplified positive resist composition. A resist composition, in particular, a chemically amplified positive resist composition comprising the polymer exhibits high resolution, good in-plane dimension uniformity of developed resist patterns on substrates and excellent etching resistance. Therefore, such a resist composition can be used as micro patterning compositions, in particular, for fabricating VLSIs or photomasks.

DESCRIPTION OF THE INVENTION AND A PREFERRED EMBODIMENT

Hereinafter, embodiments of the present invention are descried; however, the present invention is not restricted thereto.

In order to achieve the object, the present inventors have thoroughly studied. As a result, the inventors have found that a polymer at least comprising repeating units represented by the following general formulae (1) and (2), optionally further comprising repeating units represented by the following general formulae (3) or (4), and having a mass average molecular weight of 1,000 to 500,000 is suitable as a base resin for a resist composition, in particular, a chemically amplified positive resist composition; a resist composition comprising the polymer exhibits high resolution and good in-plane dimension uniformity of developed resist patterns on substrates, thereby being compatible with reductions in size of pattern critical dimension; and thus such a resist composition is highly practical and very suitable as a resist composition for fabricating VLSIs or photomasks. Thus, they have accomplished the present invention.

That is, the polymer according to the present invention at least comprises repeating units represented by the following general formulae (1) and (2), and the polymer having a mass average molecular weight of 1,000 to 500,000, (1)

(2)

wherein $R_1$ and $R_2$ independently represent a hydrogen atom or a methyl group;

$R_3$ represents any one of a hydroxy group, a linear or branched alkyl group, a halogen atom, and a trifluoromethyl group;

$R_4$ represents a hydrogen atom or a $C_{1-10}$ linear, branched or cyclic alkyl group;

Z represents a $C_{7-30}$ aliphatic polycyclic alkyl group;

t is a positive integer of from 1 to 5;

u is 0 or a positive integer of from 1 to 4; and p and q are positive numbers.

The polymer according to the present invention, may further comprise a repeating unit represented by the following formulae (3) or (4), (3)

wherein r is a positive number, (4)

wherein s is a positive number.

Examples of the linear or branched alkyl group in the general formula (2) may include: a methyl group, an ethyl group, a propyl group, an isopropyl group, a n-butyl group, an iso-butyl group, and tert-butyl group.

Examples of the halogen atom in $R_3$ may include: a fluorine atom, a chlorine atom, and a bromine atom.

Preferred examples of Z in the general formula (2) are shown below.

-continued

Among the above examples, in particular, Z is preferably represented by any one of the following formulae (5), (6) and (7).

(5)

(6)

(7)

It is extremely preferable that Z in the general formula (2) is directly bonded to the oxygen atom via a secondary carbon atom on the cyclic structure. In this case, the polymer is less prone to become an unstable compound and thus a resist composition comprising the polymer is less prone to have insufficient storage stability and deteriorated resolution in comparison with the case where Z is bonded to the oxygen atom via a tertiary carbon atom on the cyclic structure. In addition, there is less possibility that the glass transition temperature (Tg) of the polymer decreases and developed resist pattern is deformed by baking.

Besides the repeating units (1) to (4), the polymer according to the present invention may comprise another components such as a tertiary (meth)acrylate or a common linear or branched alkoxyalkoxy styrene.

Ratios of the repeating units (1), (2), and (3) preferably satisfy $0<p/(p+q+r)\leq0.8$, more preferably $0.3\leq p/(p+q+r)\leq0.8$; preferably $0<q/(p+q+r)\leq0.5$, more preferably $0.10\leq q/(p+q+r)\leq0.30$; and preferably $0\leq r/(p+q+r)\leq0.35$.

Ratios of the repeating units (1), (2), and (4) preferably satisfy $0<p/(p+q+s)\leq0.8$, more preferably $0.3\leq p/(p+q+s)\leq0.8$; preferably $0<q/(p+q+s)\leq0.5$, more preferably $0.10\leq q/(p+q+s)\leq0.30$; and preferably $0\leq s/(p+q+s)\leq0.30$.

When the ratio p is equal to or less than 0.8, there is less possibility that the alkaline dissolution rate of a non-exposed area becomes too high and developed resist pattern profiles have problems.

When the ratio q is 0 and the polymer does not have the repeating unit (2), the polymer exhibits no contrast of alkaline dissolution rates and thus resolution is deteriorated. Therefore, the polymer according to the present invention indispensably requires the repeating unit (2).

When the ratio q is of from 0.10 to 0.30, there is less possibility that resolution is deteriorated or defects are generated after development.

By increasing the ratios r and s, etching resistance is enhanced. When the ratio r is equal to or less than 0.35 and the ratio s is equal to or less than 0.30, there is less possibility that resolution is deteriorated.

By properly selecting the values of p, q, r and s in the regions, resolution, etching resistance, and control of pattern profile can be conducted arbitrarily.

The polymer according to the present invention is required to have a mass average molecular weight of 1,000 to 500,000, which is measured by gel permeation chromatography using polystyrene as a reference sample by using HLC-8120GPC from Tosoh Corporation. Preferably, the mass average molecular weight is of from 2,000 to 30,000.

When the mass average molecular weight is less than 1,000, the resist composition has insufficient heat resistance. When the mass average molecular weight is greater than 500,000, alkali solubility of the resist composition is deteriorated and thus developed resist patterns tend to exhibit line edge roughness clearly.

In the polymer according to the present invention, when a copolymer comprising multi-components of the formulae (1), (2), and (3) or (4) has a narrow molecular weight distribution (Mw/Mn), there is less possibility that foreign matters are observed on patterns or pattern profiles are deteriorated due to the presence of polymers with low molecular weights and polymers with high molecular weights. As the pattern rule is reduced in size, such influences by molecular weight and molecular weight distribution tend to become greater. Therefore, in order to obtain a resist composition suitably used in fine pattern dimension, a multi-component copolymer to be used preferably has a narrow molecular weight distribution of 1.0 to 2.5, in particular, 1.0 to 1.8.

Hereinafter, there is described examples of a method for preparing the polymer according to the present invention. However, the present invention is not restricted thereto.

As for a method of preparing a polymer having the repeating units (1) and (2), an example is described below. An acetoxystyrene monomer and a radical initiator are added to an organic solvent to conduct thermal polymerization. Thus obtained polymer in the organic solvent is subjected to base hydrolysis to deprotect the acetoxy groups, thereby providing polyhydroxystyrene. Examples of the organic solvent used on the polymerization may include: toluene, benzene, tetrahydrofuran, diethyl ether, dioxane, and the like. Examples of the polymerization initiator may include: 2,2'-azobisisobutyronitrile, 2,2'-azobis(2,4-dimethylvaleronitrile), dimethyl-2,2-azobis(2-methylpropionate), benzoyl peroxide, lauroyl peroxide, and the like. Polymerization can be conducted preferably by heating to 50° C. to 80° C. The reaction time may be 2 to 100 hours, preferably 5 to 20 hours. Examples of a base on the base hydrolysis may include: aqueous ammonia, triethylamine, and the like. The reaction temperature of the base hydrolysis is −20° C. to 100° C., and preferably 0° C. to 60° C. The reaction time may be 0.2 to 100 hours, preferably 0.5 to 20 hours.

Subsequently, thus obtained polyhydroxystyrene is dissolved in an organic solvent, and a reaction is conducted in which an aliphatic polycyclic alkyl vinyl ether is added thereto in the presence of an acid catalyst, thereby providing a polymer having the repeating units (1) and (2). Examples of the acid catalyst used on the reaction may include: methansulfonic acid, trifluoroacetic acid, oxalic acid, pyridine methanesulfonate, and the like. The reaction temperature is preferably 5° C. to 20° C. The reaction time may be 0.2 to 10 hours, preferably 0.5 to 5 hours.

Another method of preparing a polymer having the repeating units (1) and (2) is described below. The polyhydroxystyrene obtained above is dissolved in an organic solvent. A compound represented by the following general formula (8) is added dropwise thereto in a basic condition to proceed a reaction, thereby providing a polymer. The polymer is washed, crystallized, and dried to obtain the polymer having the repeating units (1) and (2).

(8)

wherein X represents any one of a chlorine atom, a bromine atom and iodine atom; and $R_4$ and Z are as defined above.

Still another method is described below. An acetoxystyrene monomer and an aliphatic polycyclic alkyloxyethoxystyrene monomer are copolymerized, and then the acetoxy groups are deprotected in a basic condition, thereby providing a polymer having the repeating units (1) and (2).

As for a method of preparing a polymer having the repeating units (1), (2) and (3), an example is described below. An acetoxystyrene monomer, an indene monomer and a radical initiator are added to an organic solvent and then thermal polymerization is conducted. Thus obtained polymer in the organic solvent is subjected to base hydrolysis to deprotect the acetoxy groups, thereby providing a hydroxystyrene/indene two-component polymer. The organic solvent, the polymerization initiator, the reaction temperature and the reaction time on the polymerization; and the base, the reaction temperature and the reaction time on the base hydrolysis are the same as defined above.

Subsequently, thus obtained hydroxystyrene/indene copolymer is dissolved in an organic solvent, and a reaction is conducted in which an aliphatic polycyclic alkyl vinyl ether is added thereto in the presence of an acid catalyst, thereby providing a polymer having the repeating units (1), (2) and (3). The acid catalyst, the reaction temperature and the reaction time on the reaction are the same as defined above.

Another method is described below. The hydroxystyrene/indene two-component copolymer obtained above is dissolved in an organic solvent. The compound represented by the above general formula (8) is added dropwise thereto in a basic condition to proceed a reaction, thereby providing a polymer. The polymer is washed, crystallized, and dried to obtain the polymer having the repeating units (1), (2) and (3).

Still another method is described below. An acetoxystyrene monomer, an aliphatic polycyclic alkyloxyethoxystyrene monomer, and an indene monomer are copolymerized, and then the acetoxy groups are deprotected in a basic condition, thereby providing a polymer having the repeating units (1), (2) and (3).

A polymer having the repeating units (1), (2) and (4) can be prepared by using an acenaphthylene monomer instead of the indene monomer in the preparation of the polymer having the repeating units (1), (2) and (3).

The polymer according to the present invention preferably has a CLogP value not less than 2.9, more preferably, the CLogP value is not less than 3.0. The CLogP value is a calculated value of a hydrophobic parameter.

The CLogP is obtained by calculating LogP with a computer. The LogP is a representation of a hydrophobic parameter in common logarithm. The hydrophobic parameter is a concentration ratio between a compound and an organic solvent (n-octanol) incompatible with water when the compound is dissolved in the organic solvent, the organic solvent is mixed with water and a state of equilibrium is achieved. The hydrophobic parameter is obtained by dividing the concentration of the compound in the organic solvent by the concentration of the compound in water, that is, the hydrophobic parameter is a partition coefficient.

Figure 1:
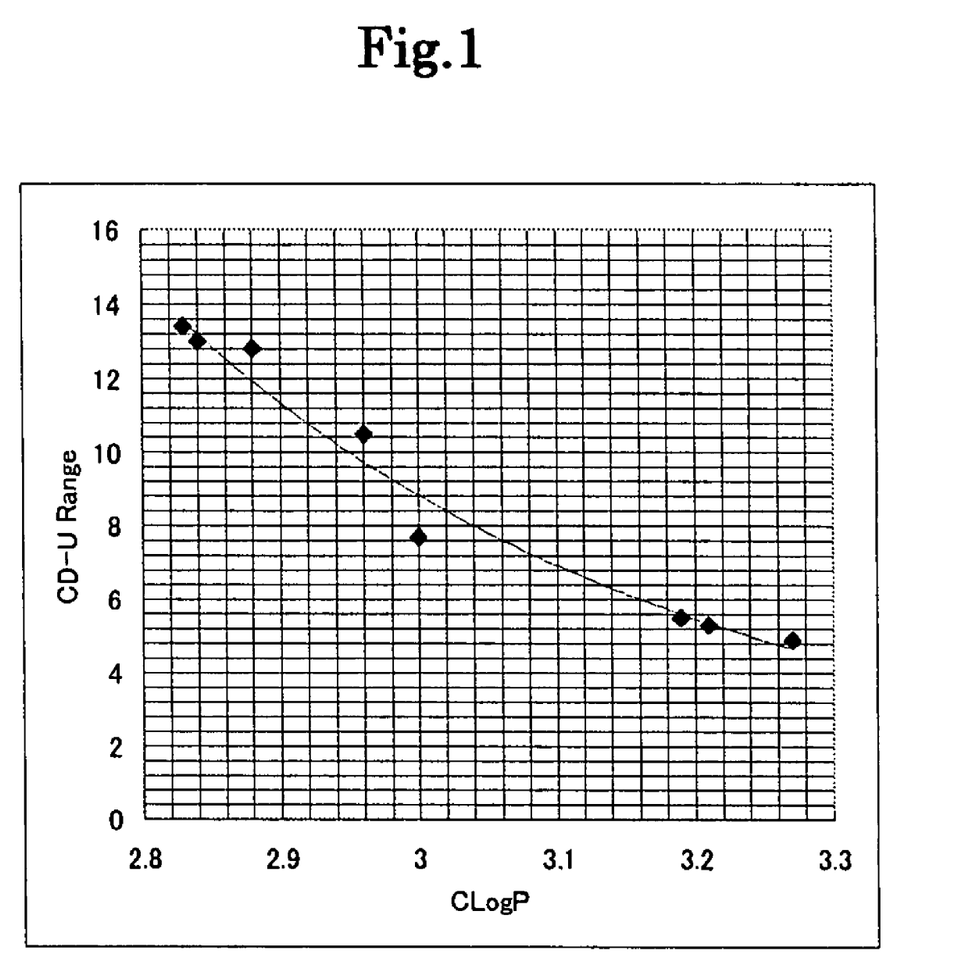
FIG. 1 is a graph showing a relation between a CLogP value of a polymer and a CD uniformity range (CD-U Range: the difference between a maximum and a minimum among measurement values of critical dimension (CD) of the space in line and space pattern) of a resist composition comprising the polymer.

The present inventors have investigated a relation between a CLogP value of a polymer and a CD uniformity range (CD-U Range: the difference between a maximum and a minimum among measurement values of critical dimension (CD) of the space in developed line and space pattern) of a resist composition comprising the polymer. The results obtained are shown in FIG. 1. The smaller the CD-U Range is, the more uniform the in-plane dimension of developed resist pattern on a substrate is.

As is evident from FIG. 1, a resist composition comprising a polymer having a CLogP value not less than 2.9, particularly not less than 3.0, exhibits a small CD-U Range value. That is, such a resist composition provides even better in-plane dimension uniformity of developed resist patterns on substrates.

Therefore, the polymer according to the present invention preferably has a CLogP value not less than 2.9, and more preferably a CLogP value not less than 3.0.

As a matter of fact, the calculated value CLogP of each copolymer unit can be determined with a software such as Chem Draw Ultra 8.0. For example, in the case of hydroxystyrene, the value of the following structural formula unit is defined as the calculated value CLogP of a copolymer unit. As a result, CLogP is 2.50 (rounding off the number to the two decimal place).

Furthermore, examples of a structural formula of each copolymer unit and its calculated value CLogP are shown below.

CLogP = 2.50    CLogP = 3.82    CLogP = 3.83

-continued

CLogP = 5.94    CLogP = 6.78    CLogP = 7.65

CLogP = 6.87    CLogP = 3.16    CLogP = 3.77

CLogP = 5.94

The CLogP value of a polymer to be used as a resist composition is defined as an arithmetic mean of the CLogP values of copolymer units determined by the above method.

A resist composition comprising the polymer according to the present invention exhibits high resolution, good in-plane dimension uniformity of developed resist patterns on substrates such as mask blanks and excellent etching resistance. Therefore, such a resist composition can be used as a micro patterning composition, in particular, for fabricating VLSIs or photomasks.

Furthermore, a resist composition at least comprising an organic solvent, the polymer according to the present invention as a base resin, and an acid generator can be used as a chemically amplified positive resist composition.

Non-limiting examples of the organic solvent may include: butyl acetate, amyl acetate, cyclohexyl acetate, 3-methoxybutyl acetate, methyl ethyl ketone, methyl amyl ketone, cyclohexanone, cyclopentanone, 3-ethoxyethylpropionate, 3-ethoxymethylpropionate, 3-methoxymethylpropionate, methyl acetoacetate, ethyl acetoacetate, diacetone alcohol, methyl pyruvate, ethyl pyruvate, propylene glycol monomethyl ether, propylene glycol monoethyl ether, propylene glycol monomethyl ether propionate, propylene glycol monoethyl ether propionate, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethyl sulfoxide, γ-butyrolactone, propylene glycol methyl ether acetate, propylene glycol ethyl ether acetate, propylene glycol propyl ether acetate, methyl lactate, ethyl lactate, propyl lactate, tetramethylenesulfone, and the like. Particularly preferred are propylene glycol alkyl ether acetates and alkyl lactates. The solvents may be used alone or in admixture.

An example of a preferred mixed solvent is a combination of propylene glycol alkyl ether acetates and alkyl lactates. The alkyl groups of propylene glycol alkyl ether acetates in the present invention may be $C_{1-4}$ alkyl groups such as a methyl group, an ethyl group, or a propyl group. Among these, a methyl group or an ethyl group is preferable. The propylene glycol alkyl ether acetates have a 1,2-substituted type and 1,3-substituted type, and there are 3 isomers depending on the combination of substituted positions. The propylene glycol alkyl ether acetates may be used as one isomer alone or a mixture of the isomers.

The alkyl groups of the alkyl lactates may be $C_{1-4}$ alkyl groups such as a methyl group, an ethyl group, or a propyl group. Among these, a methyl group or an ethyl group is preferable.

When propylene glycol alkyl ether acetate is added as a solvent, the additional amount of propylene glycol alkyl ether acetate is preferably 50 mass % or more relative to the total amounts of all the solvents. When alkyl lactate is added as a solvent, the additional amount of alkyl lactate is preferably 50 mass % or more relative to the total amounts of all the solvents.

When a mixed solvent of propylene glycol alkyl ether acetate and alkyl lactate is used as the solvent, the total amount thereof is preferably 50 mass % or more relative to the total amounts of all the solvents. In this case, more preferably, propylene glycol alkyl ether acetate accounts for 60 to 95 mass %, and alkyl lactate accounts for 5 to 40 mass %. When propylene glycol alkyl ether acetate accounts for 60 mass % or more, there is less possibility that application properties are deteriorated. When propylene glycol alkyl ether acetate accounts for 95 mass % or less, there is less possibility of causing problems such as insufficient solubility, or generation of particles or foreign matters. When alkyl lactate accounts for 5 mass % or more, there is less possibility of causing problems such as insufficient solubility, or increase of particles or foreign matters. When alkyl lactate accounts for 40 mass % or less, there is less possibility that the mixed solvent has high viscosity and that problems occur such as deteriorated application properties or deteriorated storage stability.

The additional amount of the organic solvents is preferably 300 to 2,000 parts by mass, more preferably 400 to 1,000 parts by mass, based on 100 parts by mass of the solid content of a chemically amplified positive resist composition. However, the additional amount is not restricted thereto as long as the resist composition has a concentration with which a film can be formed by conventional film forming methods.

As for an acid generator that the chemically amplified positive resist composition comprises, for example, a photoacid generator can be used. Any photoacid generator can be used as long as the compound generates an acid upon exposure to a high energy beam.

Preferred photoacid generators may include sulfonium salts, iodonium salts, sulfonyl diazomethanes, N-sulfonyl oxyimide type photoacid generators, benzoyl sulfonate type photoacid generators, pyrogallol trisulfonate type photoacid generators, nitrobenzyl sulfonate type photoacid generators, sulfone type photoacid generators, glyoxime derivative type photoacid generators, and the like. Examples of the photoacid generators are shown below in detail, and they can be used alone or in admixture.

A sulfonium salt is a salt of sulfonium cation and sulfonate.

Examples of the sulfonium cation may include: triphenyl sulfonium, (4-tert-butoxy phenyl)diphenyl sulfonium, bis(4-tert-butoxy phenyl)phenyl sulfonium, tris(4-tert-butoxy phenyl)sulfonium, (3-tert-butoxy phenyl)diphenyl sulfonium, bis(3-tert-butoxy phenyl)phenyl sulfonium, tris(3-tert-butoxy phenyl)sulfonium, (3,4-ditert-butoxy phenyl)diphenyl sulfonium, bis(3,4-ditert-butoxy phenyl)phenyl sulfonium, tris(3,4-ditert-butoxy phenyl)sulfonium, diphenyl(4-thiophenoxy phenyl)sulfonium, (4-tert-butoxy carbonyl methyl oxy phenyl)diphenyl sulfonium, tris(4-tert-butoxy carbonyl methyl oxy phenyl)sulfonium, (4-tert-butoxy phenyl)bis(4-dimethyl amino phenyl)sulfonium, tris(4-dimethyl amino phenyl)sulfonium, 2-naphthyl diphenyl sulfonium, dimethyl2-naphthyl sulfonium, 4-hydroxy phenyl dimethyl sulfonium, 4-methoxy phenyl dimethyl sulfonium, trimethyl sulfonium, 2-oxocyclohexyl cyclohexyl methyl sulfonium, trinaphthyl sulfonium, tribenzyl sulfonium, and the like.

In addition, examples of the sulfonate may include: trifluoro methanesulfonate, nonafluoro butane sulfonate, heptadecafluoro octane sulfonate, 2,2,2-trifluoro ethane sulfonate, pentafluoro benzene sulfonate, 4-trifluoro methyl benzene sulfonate, 4-fluorobenzene sulfonate, toluene sulfonate, benzene sulfonate, 4-(4-toluene sulfonyloxy)benzene sulfonate, naphthalene sulfonate, camphor sulfonate, octane sulfonate, dodecylbenzene sulfonate, butane sulfonate, methanesulfonate, and the like.

Examples of a sulfonium salt may include combinations of the sulfonium cation and the sulfonate.

An iodonium salt is a salt of iodonium cation and sulfonate.

Examples of iodonium cation may include: aryl iodonium cation such as diphenyl iodonium, bis(4-tert-butyl phenyl) iodonium, 4-tert-butoxy phenyl phenyl iodonium, 4-methoxyphenyl phenyl iodonium, and the like.

In addition, examples of sulfonate may include: trifluoro methanesulfonate, nonafluoro butane sulfonate, heptadecafluoro octane sulfonate, 2,2,2-trifluoro ethane sulfonate, pentafluoro benzene sulfonate, 4-trifluoro methyl benzene sulfonate, 4-fluorobenzene sulfonate, toluene sulfonate, benzene sulfonate, 4-(4-toluene sulfonyloxy)benzene sulfonate, naphthalene sulfonate, camphor sulfonate, octane sulfonate, dodecylbenzene sulfonate, butane sulfonate, methanesulfonate, and the like.

Examples of an iodonium salt may be combinations of the iodonium cation and the sulfonate.

Examples of sulfonyl diazomethane may include: bissulfonyl diazomethane and sulfonyl-carbonyl diazomethane such as bis(ethyl sulfonyl)diazomethane, bis(1-methylpropyl sulfonyl)diazomethane, bis(2-methylpropyl sulfonyl)diazomethane, bis(1,1-dimethylethyl sulfonyl)diazomethane, bis(cyclohexylsulfonyl)diazomethane, bis(perfluoro isopropyl sulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, 4-methylphenylsulfonyl benzoyl diazomethane, tert-butylcarbonyl-4-methylphenylsulfonyl diazomethane, 2-naphthylsulfonyl benzoyl diazomethane, 4-methylphenylsulfonyl-2-naphthoyl diazomethane, methylsulfonyl benzoyl diazomethane, tert-butoxy carbonyl-4-methylphenylsulfonyl diazomethane.

Examples of N-sulfonyl oxyimide type photoacid generator may include: combined compounds of imide structure such as succinimide, naphthalene dicarboxylmide, phthalimide, cyclohexyl dicarboxylmide, 5-norbornene-2,3-dicarboxylmide, 7-oxabicyclo[2.2.1]-5-heptene-2,3-dicarboxylmide; and trifluoro methanesulfonate, nonafluoro butane sulfonate, heptadecafluoro octane sulfonate, 2,2,2-trifluoro ethane sulfonate, pentafluoro benzene sulfonate, 4-trifluoro methyl benzene sulfonate, 4-fluorobenzene sulfonate, toluene sulfonate, benzene sulfonate, naphthalene sulfonate, camphor sulfonate, octane sulfonate, dodecylbenzene sulfonate, butane sulfonate, methanesulfonate, and the like.

Examples of benzoin sulfonate type photoacid generator may include: benzoin tosylate, benzoin mesylate, benzoin butane sulfonate, and the like.

Examples of pyrogallol trisulfonate type photoacid generator may include: compounds obtained by substituting all hydroxyl groups of pyrogallol, phloroglucine, catechol, resorcinol and hydroquinone with trifluoro methanesulfonate, nonafluoro butane sulfonate, heptadecafluoro octane sulfonate, 2,2,2-trifluoro ethane sulfonate, pentafluoro benzene sulfonate, 4-trifluoro methyl benzene sulfonate, 4-fluorobenzene sulfonate, toluene sulfonate, benzene sulfonate, naphthalene sulfonate, camphor sulfonate, octane sulfonate, dodecylbenzene sulfonate, butane sulfonate, methanesulfonate, and the like.

Examples of nitro benzyl sulfonate type photoacid generator may include: 2,4-dinitro benzyl sulfonate, 2-nitro benzyl sulfonate, 2,6-dinitro benzyl sulfonate, and the like. Examples of sulfonate may include: trifluoro methanesulfonate, nonafluoro butane sulfonate, heptadecafluoro octane sulfonate, 2,2,2-trifluoro ethane sulfonate, pentafluoro benzene sulfonate, 4-trifluoro methyl benzene sulfonate, 4-fluorobenzene sulfonate, toluene sulfonate, benzene sulfonate, naphthalene sulfonate, camphor sulfonate, octane sulfonate, dodecylbenzene sulfonate, butane sulfonate, methanesulfonate, and the like. In addition, compounds in which a nitro group on the benzyl side is substituted with a trifluoromethyl group can also be used.

Examples of sulfone type photoacid generator may include: bis(phenylsulfonyl)methane, bis(4-methyl phenylsulfonyl)methane, bis(2-naphthyl sulfonyl)methane, 2,2-bis(phenylsulfonyl)propane, 2,2-bis(4-methyl phenylsulfonyl)propane, 2,2-bis(2-naphthyl sulfonyl)propane, 2-methyl-2-(p-toluene sulfonyl)propiophenone, 2-(cyclohexyl carbonyl)-2-(p-toluene sulfonyl)propane, 2,4-dimethyl-2-(p-toluene sulfonyl)pentane-3-one, and the like.

Examples of glyoxime derivative type photoacid generator may include: bis-o-(p-toluene sulfonyl)-α-dimethylglyoxime, bis-o-(p-toluene sulfonyl)-α-diphenyl glyoxime, bis-o-(p-toluene sulfonyl)-α-dicyclohexyl glyoxime, bis-o-(p-toluene sulfonyl)-2,3-pentanedione glyoxime, bis-o-(p-toluene sulfonyl)-2-methyl-3,4-pentanedione glyoxime, bis-o-(n-butane sulfonyl)-α-dimethylglyoxime, bis-o-(n-butane sulfonyl)-α-diphenyl glyoxime, bis-o-(n-butane sulfonyl)-α-dicyclohexyl glyoxime, bis-o-(n-butane sulfonyl)-2,3-pentanedione glyoxime, bis-o-(n-butane sulfonyl)-2-methyl-3,4-pentanedione glyoxime, bis-o-(methane sulfonyl)-α-dimethylglyoxime, bis-o-(trifluoromethane sulfonyl)-α-dimethylglyoxime, bis-o-(1,1,1-trifluoro ethane sulfonyl)-α-dimethylglyoxime, bis-o-(tert-butane sulfonyl)-α-dimethylglyoxime, bis-o-(perfluorooctane sulfonyl)-α-dimethylglyoxime, bis-o-(cyclohexyl sulfonyl)-α-dimethylglyoxime, bis-o-(benzene sulfonyl)-α-dimethylglyoxime, bis-o-(p-fluorobenzene sulfonyl)-α-dimethylglyoxime, bis-o-(p-tert-butylbenzene sulfonyl)-α-dimethylglyoxime, bis-o-(xylene sulfonyl)-α-dimethylglyoxime, bis-o-(camphor sulfonyl)-α-dimethylglyoxime, and the like.

In particular, preferred photoacid generators are sulfonium salts, bissulfonyl diazomethanes, and N-sulfonyl oxyimides.

An optimum anion of generated acid varies depending on the susceptibility of an acid labile group of a polymer to cleavage and the like. In general, an anion of generated acid is selected from anions exhibiting nonvolatility and not extremely high diffusibility. Such preferred anions may include: benzenesulfonic acid anion, toluenesulfonic acid anion, 4-(4-toluenesulfonyloxy)benzenesulfonic acid anion, pentafluorobenzenesulfonic acid anion, 2,2,2-trifluoroethanesulfonic acid anion, nonafluorobutanesulfonic acid anion, heptadecafluorooctanesulfonic acid anion, and camphorsulfonic acid anion.

An amount of an acid generator to be added to the chemically amplified positive resist composition according to the present invention is 0 to 20 parts by mass, more preferably 1 to 10 parts by mass, based on 100 parts by mass of the solid content of the resist composition.

The photoacid generators may be used alone or in admixture. Furthermore, a photoacid generator having low transmittance at an exposure wavelength may be used, and the transmittance of a resist film can be controlled with the additional amount of the photoacid generator.

A surfactant can be further added to the chemically amplified positive resist composition of the present invention for the purpose of improving application properties and the like.

Non-limiting examples of such a surfactant may include: nonionic surfactants such as polyoxyethylene alkyl ethers such as polyoxyethylene lauryl ether, polyoxyethylene stearyl ether, polyoxyethylene cetyl ether, or polyoxyethylene olein ether; polyoxyethylene alkyl aryl ethers such as polyoxyethylene octyl-phenol ether, or polyoxyethylene nonyl phenol ether; polyoxyethylene polyoxy propylene block copolymers; sorbitan fatty acid esters such as sorbitan monolaurate, sorbitan monopalmitate, or sorbitan monostearate; polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, or polyoxyethylene sorbitan tristearate; fluorinated surfactants such as EFTOP EF301, EF303 or EF352 (manufactured by Tohchem), MEGAFACE F171, F172, or F173 (manufactured by Dainippon Ink Industry), Fluorad FC430, or FC431 (manufactured by Sumitomo 3M), Asahiguard AG710, Surflon S-381, S-382, SC101, SC102, SC103, SC104, SC105 and SC106, Surfynol E1004, KH-10, KH-20, KH-30 or KH-40 (manufactured by Asahi Glass Co., Ltd.); organo siloxane polymer KP-341, X-70-092, or X-70-093 (manufactured by Shin-Etsu Chemical Co., Ltd.), acrylate or methacrylate based POLY-FLOW No. 75 or No. 95 (manufactured by KYOEISHA CHEMICAL), or the like. Among the surfactants, FC430, Surflon S-381, Surfynol E1004, KH-20 and KH-30 are preferably used. Above surfactants may be used alone or in admixture.

The amount of the surfactant to be added to the chemically amplified positive resist composition of the present invention is preferably 2 parts by mass or less, and more preferably 1 part by mass or less based on 100 parts by mass of the solid content in the resist composition.

The chemically amplified positive resist composition of the present invention may further comprise a basic compound.

As for the basic compound, suitable compounds are capable of suppressing an acid diffusion rate when an acid generated from an acid generator diffuses in a resist film. Addition of such a basic compound suppresses a diffusion rate of an acid in a resist film, thereby enhancing resolution, suppressing change of sensitivity after exposure, reducing substrate dependency and environmental dependency, and improving exposure margin, pattern profiles and the like.

Examples of such a basic compound may include: primary, secondary and tertiary aliphatic amines, mixed amines, aromatic amines, heterocyclic amines, nitrogen-containing compounds having a carboxy group, nitrogen-containing compounds having a sulfonyl group, nitrogen-containing compounds having a hydroxyl group, nitrogen-containing compounds having a hydroxy phenyl group, nitrogen-containing alcohol compounds, amide derivatives, imide derivatives and the like.

Examples of the primary aliphatic amines may include: ammonia, methylamine, ethylamine, n-propylamine, isopropylamine, n-butylamine, isobutyl amine, sec-butyl-amine, tert-butylamine, pentylamine, tert-amylamine, cyclopentyl amine, hexylamine, cyclohexyl amine, heptylamine, octylamine, nonylamine, decyl amine, dodecylamine, cetylamine, methylene diamine, ethylenediamine, tetraethylene pentamine and the like.

Examples of the secondary aliphatic amines may include: dimethylamine, diethylamine, di-n-propylamine, diisopropyl amine, di-n-butylamine, diisobutyl amine, di-sec-butylamine, dipentylamine, dicyclopentyl amine, dihexyl amine, dicyclohexyl amine, diheptylamine, dioctylamine, dinonylamine, didecylamine, didodecylamine, dicetylamine, N,N-dimethyl methylenediamine, N,N-dimethyl ethylenediamine, N,N-dimethyl tetraethylene pentamine and the like.

Examples of the tertiary aliphatic amines may include: trimethylamine, triethylamine, tri-n-propylamine, triisopropyl amine, tri-n-butyl amine, triisobutyl amine, tri-sec-butyl amine, tripentyl amine, tricyclopentyl amine, trihexyl amine, tricyclohexyl amine, triheptyl amine, trioctyl amine, trinonyl amine, tridecyl amine, tridodecyl amine, tricetyl amine, N,N,N',N'-tetra methyl methylene diamine, N,N,N',N'-tetramethyl ethylenediamine, N,N,N',N'-tetramethyl tetraethylene pentamine and the like.

Moreover, examples of the mixed amines may include: a dimethyl ethylamine, methyl ethyl propyl amine, benzylamine, phenethyl amine, benzyl dimethylamine, and the like.

Examples of the aromatic amines and the heterocyclic amines may include: an aniline derivative (for example, aniline, N-methyl aniline, N-ethyl aniline, N-propyl aniline, N,N-dimethylaniline, 2-methyl aniline, 3-methyl aniline, 4-methyl aniline, ethyl aniline, propyl aniline, trimethyl aniline, 2-nitroaniline, 3-nitroaniline, 4-nitroaniline, 2,4-dinitro aniline, 2,6-dinitro aniline, 3,5-dinitro aniline, N,N-dimethyl toluidine and the like), diphenyl(p-tolyl)amine, methyl diphenylamine, triphenylamine, phenylenediamine, naphthylamine, diamino naphthalene, a pyrrole derivative (for example, pyrrole, 2H-pyrrole, 1-methylpyrrole, 2,4-dimethylpyrrole, 2,5-dimethylpyrrole, N-methylpyrrole, and the like), oxazole derivative (for example, oxazole, isoxazole and the like), a thiazole derivative (for example, thiazole, isothiazole, and the like), an imidazole derivative (for example, imidazole, 4-methyl imidazole, 4-methyl-2-phenyl imidazole and the like), a pyrazole derivative, a furazan derivative, a pyrroline derivative (for example, pyrroline, 2-methyl-1-pyrroline and the like), a pyrrolidine derivative (for example, pyrrolidine, N-methylpyrrolidine, pyrrolidinone, N-methylpyrolidone and the like), an imidazoline derivative, an imidazolidine derivative, a pyridine derivative (for example, pyridine, methylpyridine, ethyl pyridine, propyl pyridine, butyl pyridine, 4-(1-butyl pentyl)pyridine, dimethylpyridine, trimethylpyridine, triethyl pyridine, phenyl pyridine, 3-methyl-2-phenyl pyridine, 4-tert-butyl pyridine, diphenyl pyridine, benzyl pyridine, methoxy pyridine, butoxy pyridine, dimethoxy pyridine, 1-methyl-2-pyridine, 4-pyrrolidino pyridine, 1-methyl-4-phenylpyridine, 2-(1-ethylpropyl)pyridine, amino pyridine, dimethyl amino pyridine and the like), a pyridazine derivative, a pyrimidine derivative, a pyrazine derivative, a pyrazoline derivative, a pyrazolidine derivative, a piperidine derivative, a piperazine derivative, a morpholine derivative, an indole derivative, an isoindole derivative, a 1H-indazole derivative, an indoline derivative, a quinoline derivative (for example, quinoline, 3-quinoline carbonitrile, and the like), an isoquinoline derivative, a cinnoline derivative, a quinazoline derivative, a quinoxaline derivative, a phthalazine derivative, a purine derivative, a pteridine derivative, a carbazole derivative, a phenanthridine derivative, an acridine derivative, a phenazine derivative, 1,10-phenanthroline derivative, an adenine derivative, an adenosine derivative, a guanine derivative, a guanosine derivative, an uracil derivative, an uridine derivative and the like.

Furthermore, examples of the nitrogen-containing compounds having a carboxy group may include: aminobenzoic acid, indole carboxylic acid, and an amino acid derivative (for example, nicotinic acid, alanine, arginine, aspartic acid, glutamic acid, glycine, histidine, isoleucine, glycyl leucine, leucine, methionine, phenylalanine, threonine, lysine, 3-aminopyrazine-2-carboxylic acid, or methoxy alanine) and the like. Examples of the nitrogen-containing compounds having a sulfonyl group may include: 3-pyridine sulfonic acid, pyridinium p-toluene sulfonate and the like. Examples of the nitrogen-containing compounds having a hydroxyl group, the nitrogen-containing compounds having a hydroxy phenyl group, and the nitrogen-containing alcohol compounds may include: 2-hydroxy pyridine, amino cresol, 2,4-quinoline diol, 3-indole methanol hydrate, monoethanolamine, diethanolamine, triethanolamine, N-ethyl diethanolamine, N,N-diethyl ethanolamine, triisopropanol amine, 2,2'-iminodiethanol, 2-amino ethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxy ethyl)pyrrolidine, 1-(2-hydroxyethyl)-2-pyrrolidinone, 3-piperidino-1,2-propanediol, 3-pyrrolidino-1,2-propanediol, 8-hydroxy julolidine, 3-quinuclidinol, 3-tropanol, 1-methyl-2-pyrrolidine ethanol, 1-aziridine ethanol, N-(2-hydroxyethyl)phthalimide, N-(2-hydroxyethyl) isonicotinamide, and the like.

Examples of the amide derivatives may include: formamide, N-methyl formamide, N,N-dimethylformamide, acetamide, N-methyl acetamide, N,N-dimethylacetamide, propione amide, benzamide, and the like.

Examples of the imide derivatives may include: phthalimide, succinimide, maleimide, and the like.

Furthermore, one or more selected from basic compounds represented by the following general formula (B)–1 may be added.

(B)–1

In the formula, n is 1, 2, or 3. The side chain X may be the same or different, and represents the following general formulae (X)–1 to (X)–3. The side chain Y may be the same or different, and represents a hydrogen atom or a linear, branched or cyclic alkyl group having 1-20 carbon atoms which may contain an ether group or a hydroxyl group. Moreover, X may bond to each other and form a ring.

(X)-1

(X)-2

(X)-3

In the formulae, $R^{300}$, $R^{302}$, and $R^{305}$ represent a linear or branched alkylene group having 1-4 carbon atoms. $R^{301}$ and $R^{304}$ represent a hydrogen atom or a linear, branched or cyclic alkyl group having 1-20 carbon atoms, which may contain one or more of a hydroxy group, an ether group, an ester group, and a lactone ring.

$R^{303}$ represents a single bond, or a linear or branched alkylene group having 1-4 carbon atoms.

$R^{306}$ represents a linear, branched or cyclic alkyl group having 1-20 carbon atoms, which may contain one or more of a hydroxy group, an ether group, an ester group, and a lactone ring.

Examples of the compound represented by the general formula (B)–1 may include, but are not limited to, tris(2-methoxy methoxy ethyl)amine, tris{2-(2-methoxyethoxy)ethyl}amine, tris{2-(2-methoxy ethoxy methoxy)ethyl}amine, tris{2-(1-methoxy ethoxy)ethyl}amine, tris{2-(1-ethoxy ethoxy)ethyl}amine, tris{2-(1-ethoxy propoxy)ethyl}amine, tris[2-{2-(2-hydroxy ethoxy)ethoxy}ethyl]amine, 4,7,13,16,21,24-hexaoxa-1,10-diazabicyclo[8.8.8] hexacosane, 4,7,13,18-tetraoxa-1,10-diazabicyclo[8.5.5] eicosane, 1,4,10,13-tetraoxa-7,16-diazabicyclo octadecane, 1-aza-12-crown-4, 1-aza-15-crown-5, 1-aza-18-crown-6, tris (2-formyloxy-ethyl)amine, tris(2-acetoxy ethyl)amine, tris (2-propionyloxy-ethyl)amine, tris(2-butylyloxy-ethyl) amine, tris(2-isobutyryl oxy-ethyl)amine, tris(2-valeryloxy-ethyl)amine, tris(2-pivaloyloxy-ethyl)amine, N,N-bis(2-acetoxy ethyl)2-(acetoxyacetoxy)ethylamine, tris(2-methoxycarbonyl oxy-ethyl)amine, tris(2-tert-butoxy carbonyl oxy-ethyl)amine, tris[2-(2-oxo propoxy)ethyl] amine, tris[2-(methoxycarbonyl methyl)oxy-ethyl]amine, tris[2-(tert-butoxycarbonylmethyloxy)ethyl]amine, tris[2-(cyclohexyloxy carbonylmethyloxy)ethyl]amine, tris(2-methoxycarbonyl ethyl)amine, tris(2-ethoxy carbonyl ethyl) amine, N,N-bis(2-hydroxy ethyl)2-(methoxycarbonyl) ethylamine, N,N-bis(2-acetoxy ethyl)2-(methoxycarbonyl) ethylamine, N,N-bis(2-hydroxy ethyl)2-(ethoxy carbonyl) ethylamine, N,N-bis(2-acetoxy ethyl)2-(ethoxy carbonyl) ethylamine, N,N-bis(2-hydroxy ethyl)2-(2-methoxy ethoxy carbonyl)ethylamine, N,N-bis(2-acetoxy ethyl)2-(2-methoxy ethoxy carbonyl)ethylamine, N,N-bis(2-hydroxy ethyl) 2-(2-hydroxy ethoxy carbonyl)ethylamine, N,N-bis(2-acetoxy ethyl)2-(2-acetoxy ethoxy carbonyl)ethylamine, N,N-bis(2-hydroxy ethyl)2-[(methoxycarbonyl) methoxycarbonyl]ethylamine, N,N-bis(2-acetoxy ethyl) 2-[(methoxycarbonyl)methoxycarbonyl]ethylamine, N,N-bis(2-hydroxy ethyl)2-(2-oxo propoxy carbonyl)ethylamine, N,N-bis(2-acetoxy ethyl)2-(2-oxo propoxy carbonyl)ethylamine, N,N-bis(2-hydroxy ethyl)2-(tetrahydro furfuryl oxycarbonyl)ethylamine, N,N-bis(2-acetoxy ethyl)2-(tetrahydro furfuryl oxy-carbonyl)ethylamine, N,N-bis(2-hydroxy ethyl) 2-[(2-oxo tetrahydrofuran-3-yl)oxy-carbonyl]ethylamine, N,N-bis(2-acetoxy ethyl)2-[(2-oxo-tetrahydrofuran-3-yl) oxy-carbonyl]ethylamine, N,N-bis(2-hydroxy ethyl)2-(4-hydroxy butoxy carbonyl)ethylamine, N,N-bis(2-formyl oxyethyl)2-(4-formyloxybutoxy carbonyl)ethylamine, N,N-bis (2-formyl oxy-ethyl)2-(2-formyloxy ethoxy carbonyl) ethylamine, N,N-bis(2-methoxy ethyl)2-(methoxycarbonyl) ethylamine, N-(2-hydroxy ethyl)bis[2-(methoxycarbonyl) ethyl]amine, N-(2-acetoxy ethyl)bis[2-(methoxycarbonyl) ethyl]amine, N-(2-hydroxy ethyl)bis[2-(ethoxy carbonyl) ethyl]amine, N-(2-acetoxy ethyl)bis[2-(ethoxy carbonyl) ethyl]amine, N-(3-hydroxy-1-propyl)bis[2-(methoxycarbonyl)ethyl]amine, N-(3-acetoxy-1-propyl)bis [2-(methoxycarbonyl)ethyl]amine, N-(2-methoxy ethyl)bis [2-(methoxycarbonyl)ethyl]amine, N-butyl bis[2-(methoxycarbonyl)ethyl]amine, N-butyl bis[2-(2-methoxy ethoxy carbonyl)ethyl]amine, N-methyl bis(2-acetoxy ethyl) amine, N-ethyl bis(2-acetoxy ethyl)amine, N-methyl bis(2-pivaloyloxy-ethyl)amine, N-ethyl bis[2-(methoxy carbonyloxy)ethyl]amine, N-ethyl bis[2-(tert-butoxycarbonyloxy) ethyl]amine, tris(methoxycarbonyl methyl)amine, tris (ethoxy carbonyl methyl)amine, N-butyl bis (methoxycarbonyl methyl)amine, N-hexyl bis (methoxycarbonyl methyl)amine, and β-(diethylamino)-δ-valerolactone.

The basic compound may be used alone or in combination. A preferred blending amount of the basic compound is 0 to 2 parts by mass, more preferably 0.01 to 1 part by mass, based on 100 parts by mass of the solid content of the resist composition. When the blending amount is equal to or less than 2 parts by mass, there is less possibility that sensitivity is deteriorated.

In the case of using the resist composition according to the present invention, in particular, a chemically amplified positive resist composition containing an organic solvent, the polymer as a base resin, an acid generator and the like, for fabricating various integrated circuits and photomasks, lithography techniques known in the art can be used. However, the fabrication is not limited thereto.

The present invention provides a patterning process comprising: at least, a step of applying any one of the above-mentioned resist composition on a substrate; a step of conducting a heat-treatment and then exposing the substrate to a high energy beam; and a step of developing the substrate with a developer.

For example, the resist composition according to the present invention is applied to a substrate for fabricating integrated circuits such as Si, $SiO_2$, SiN, SiON, TiN, WSi, BPSG, SOG, or an organic antireflection coating by an appropriate coating method such as spin coating, roll coating, flow coating, dip coating, spray coating, or doctor coating so that the thickness of the coated film is 0.1 to 2.0 μm. The coated film is prebaked on a hot plate at 60 to 150° C. for 1 to 10 minutes, preferably at 80 to 120° C. for 1 to 5 minutes.

Subsequently, a target pattern is exposed through a predetermined mask with a light source selected from ultraviolet rays, far ultraviolet rays, electron beam, X-ray, excimer lasers, γ ray, synchrotron-radiation and the like, preferably at an exposure wavelength equal to or less than 300 nm. The exposure is preferably conducted so that an exposure dose be about 1 to 200 mJ/cm$^2$, preferably about 10 to 100 mJ/cm$^2$. Next, post exposure baking (PEB) is conducted on a hot plate at 60 to 150° C. for 1 to 5 minutes, preferably at 80 to 120° C. for 1 to 3 minutes.

Next, the substrate is developed with a developer of an aqueous alkali solution such as 0.1 to 5%, preferably 2 to 3% tetramethylammonium hydroxide (TMAH) for 0.1 to 3 minutes, preferably for 0.5 to 2 minutes according to a standard procedure such as a dip method, a puddle method, or a spray method. As a result, a target pattern is formed on the substrate.

It should be noted that the resist composition according to the present invention is particularly suitable for micropatterning with far ultraviolet ray having a wavelength from 254 to 193 nm, vacuum ultraviolet rays having a wavelength of 157 nm, an electron beam, soft X ray, X-ray, excimer lasers, γ ray, or synchrotron-radiation among high-energy beams.

EXAMPLES

Hereinafter, the present invention will be described further in detail with reference to Synthetic Examples, Examples, and Comparative Examples. However, the present invention is not limited by the following Examples. Mass-average molecular weight (Mw) denotes mass-average molecular weight relative to polystyrene standard measured by GPC.

Synthetic Example 1

In a 1 L flask, 280.7 g of acetoxy styrene, 119.3 g of indene, and 200 g of toluene as a solvent were placed. This reaction vessel was cooled to −70° C. under a nitrogen atmosphere, and subjected 3 times to degassing under reduced pressure and N$_2$ flow. After the temperature was elevated to room temperature, 13.7 g of AIBN was added as a polymerization initiator, then the temperature was elevated to 50° C. and a reaction was conducted for 40 hours. This reaction solution was concentrated in half and precipitated in a 5.0 L solution of methanol. Thus obtained white solid was filtered and dried under reduced pressure at 40° C. to obtain 260 g of a white polymer. This polymer was dissolved again in 0.4 L of methanol and 0.5 L of tetrahydrofuran. Then 140 g of triethylamine and 30 g of water were added thereto and a deprotection reaction was conducted at an elevated temperature of 60° C. The reaction was quenched with acetic acid. The reaction solution was concentrated, and then dissolved in 0.5 L of acetone. This solution was precipitated in 10 L of water as with above. The precipitation was filtered and dried to obtain 198 g of a white polymer.

The obtained polymer was analyzed by $^{13}$C, $^1$H-NMR and GPC measurement, and the following results were obtained.
Copolymerization ratio (mole ratio) hydroxystyrene:indene=0.90:0.10
Mass-average molecular weight (Mw)=10,000
Molecular-weight distribution (Mw/Mn)=1.85
This polymer is defined as poly-1.

Synthetic Example 2

In a 1 L flask, 289.3 g of acetoxy styrene, 310.7 g of indene, and 500 g of toluene as a solvent were placed. This reaction vessel was cooled to −70° C. under a nitrogen atmosphere, and subjected 3 times to degassing under reduced pressure and N$_2$ flow. After the temperature was elevated to room temperature, 14.6 g of AIBN was added as a polymerization initiator, then the temperature was elevated to 50° C. and a reaction was conducted for 40 hours. This reaction solution was concentrated in half and precipitated in a 5.0 L solution of methanol. Thus obtained white solid was filtered and dried under reduced pressure at 40° C. to obtain 260 g of a white polymer. This polymer was dissolved again in 0.4 L of methanol and 0.5 L of tetrahydrofuran. Then 140 g of triethylamine and 30 g of water were added thereto and a deprotection reaction was conducted at an elevated temperature of 60° C. The reaction was quenched with acetic acid. The reaction solution was concentrated, and then dissolved in 0.5 L of acetone. This solution was precipitated in 10 L of water as with above. The precipitation was filtered and dried to obtain 179 g of a white polymer.

The obtained polymer was analyzed by $^{13}$C, $^1$H-NMR and GPC measurement, and the following results were obtained.
Copolymerization ratio (mole ratio) hydroxystyrene:indene=0.85:0.15
Mass-average molecular weight (Mw)=6,800
Molecular-weight distribution (Mw/Mn)=1.83
This polymer is defined as poly-2.

Synthetic Example 3

In a 1 L flask, 271.7 g of acetoxy styrene, 28.3 g of acenaphthylene, and 300 g of toluene as a solvent were placed. This reaction vessel was cooled to −70° C. under a nitrogen atmosphere, and subjected 3 times to degassing under reduced pressure and N$_2$ flow. After the temperature was elevated to room temperature, 17.9 g of AIBN was added as a polymerization initiator, then the temperature was elevated to 50° C. and a reaction was conducted for 40 hours. This reaction solution was concentrated in half and precipitated in a 5.0 L solution of methanol. Thus obtained white solid was filtered and dried under reduced pressure at 40° C. to obtain 282 g of a white polymer. This polymer was dissolved again in 0.4 L of methanol and 0.5 L of tetrahydrofuran. Then 140 g of triethylamine and 30 g of water were added thereto and a deprotection reaction was conducted at an elevated temperature of 60° C. The reaction was quenched with acetic acid. The reaction solution was concentrated, and then dissolved in 0.5 L of acetone. This solution was precipitated in 10 L of water as with above. The precipitation was filtered and dried to obtain 187 g of a white polymer.

The obtained polymer was analyzed by $^{13}$C, $^1$H-NMR and GPC measurement, and the following results were obtained.
Copolymerization ratio (mole ratio) hydroxystyrene:acenaphthylene=0.93:0.07
Mass-average molecular weight (Mw)=10,800
Molecular-weight distribution (Mw/Mn)=1.79
This polymer is defined as poly-3.

Synthetic Example 4

In a 2 L flask, 180.0 g of polyhydroxystyrene-indene copolymer (poly-1) was dissolved in 1800 mL of tetrahydrofuran. To this solution were added 3.6 g of methansulfonic acid and 48.8 g of tricyclodecane vinyl ether, and a reaction was effected at 15° C. for 3 hours. The reaction was quenched by adding 18.0 g of aqueous ammonia (30%). This reaction solution was precipitated by crystallization by using 5 L of aqueous acetic acid. This precipitation was washed with water twice. Thus obtained white solid was filtered and dried under reduced pressure at 40° C. to obtain 197 g of a white polymer.

The obtained polymer was analyzed by $^{13}$C, $^1$H-NMR and GPC measurement, and the following results were obtained.
Copolymerization ratio (mole ratio) p1:q1:r=0.72:0.18:0.10
Mass-average molecular weight (Mw)=14,100
Molecular-weight distribution (Mw/Mn)=1.97
CLogP obtained from calculated value=3.19

This polymer is defined as poly-4.

poly-4

Synthetic Example 5

In a 2 L flask, 180.0 g of polyhydroxystyrene-indene copolymer (poly-2) was dissolved in 1800 mL of tetrahydrofuran. To this solution were added 3.6 g of methansulfonic acid and 21.7 g of tricyclodecane vinyl ether, and a reaction was effected at 15° C. for 3 hours. The reaction was quenched by adding 18.0 g of aqueous ammonia (30%). This reaction solution was precipitated by crystallization by using 5 L of aqueous acetic acid. This precipitation was washed with water twice. Thus obtained white solid was filtered and dried under reduced pressure at 40° C. to obtain 188 g of a white polymer.

The obtained polymer was analyzed by $^{13}C$, $^1H$-NMR and GPC measurement, and the following results were obtained.

Copolymerization ratio (mole ratio) p1:q1:r=0.77:0.08:0.15
Mass-average molecular weight (Mw)=9,000
Molecular-weight distribution (Mw/Mn)=1.87
CLogP obtained from calculated value=2.88

This polymer is defined as poly-5.

poly-5

Synthetic Example 6

In a 2 L flask, 180.0 g of polyhydroxystyrene-acenaphthylene copolymer (poly-3) was dissolved in 1800 mL of tetrahydrofuran. To this solution were added 3.6 g of methansulfonic acid and 32.0 g of tricyclodecane vinyl ether, and a reaction was effected at 15° C. for 3 hours. The reaction was quenched by adding 18.0 g of aqueous ammonia (30%). This reaction solution was precipitated by crystallization by using 5 L of aqueous acetic acid. This precipitation was washed with water twice. Thus obtained white solid was filtered and dried under reduced pressure at 40° C. to obtain 179 g of a white polymer.

The obtained polymer was analyzed by $^{13}C$, $^1H$-NMR and GPC measurement, and the following results were obtained.

Copolymerization ratio (mole ratio) p1:q1:s=0.81:0.12:0.07
Mass-average molecular weight (Mw)=13,300
Molecular-weight distribution (Mw/Mn)=1.85
CLogP obtained from calculated value=3.00

This polymer is defined as poly-6.

poly-6

Synthetic Example 7

In a 2 L flask, 180.0 g of polyhydroxystyrene-indene copolymer (poly-1) was dissolved in 1800 mL of tetrahydrofuran. To this solution were added 3.6 g of methansulfonic acid and 20.9 g of tricyclodecane isobutenyl ether, and a reaction was effected at 15° C. for 15 hours. The reaction was quenched by adding 18.0 g of aqueous ammonia (30%). This reaction solution was precipitated by crystallization by using 5 L of aqueous acetic acid. This precipitation was washed with water twice. Thus obtained white solid was filtered and dried under reduced pressure at 40° C. to obtain 165 g of a white polymer.

The obtained polymer was analyzed by $^{13}C$, $^1H$-NMR and GPC measurement, and the following results were obtained.

Copolymerization ratio (mole ratio) p1:q2:r=0.74:0.16:0.10
Mass-average molecular weight (Mw)=13,900
Molecular-weight distribution (Mw/Mn)=1.98
CLogP obtained from calculated value=3.27

This polymer is defined as poly-7.

poly-7

Synthetic Example 8

In a 2 L flask, 180.0 g of polyhydroxystyrene-indene copolymer (poly-2) was dissolved in 1800 mL of tetrahydrofuran. To this solution were added 3.6 g of methansulfonic acid and 19.5 g of pentacyclo[9.2.1.1$^{3,9}$.0$^{2,10}$.0$^{4,8}$]pentadecane vinyl ether, and a reaction was effected at 15° C. for 3 hours. The reaction was quenched by adding 18.0 g of aqueous ammonia (30%). This reaction solution was precipitated by crystallization by using 5 L of aqueous acetic acid. This precipitation was washed with water twice. Thus obtained white solid was filtered and dried under reduced pressure at 40° C. to obtain 181 g of a white polymer.

The obtained polymer was analyzed by $^{13}$C, $^1$H-NMR and GPC measurement, and the following results were obtained.

Copolymerization ratio (mole ratio) p1:q3:r=0.78:0.07:0.15

Mass-average molecular weight (Mw)=12,700

Molecular-weight distribution (Mw/Mn)=1.84

CLogP obtained from calculated value=2.96

This polymer is defined as poly-8.

poly-8

Synthetic Example 9

In a 2 L flask, 180.0 g of polyhydroxystyrene-indene copolymer (poly-1) was dissolved in 1800 mL of tetrahydrofuran. To this solution were added 3.6 g of methansulfonic acid and 18.8 g of tetracyclo[6.2.1.1$^{3,6}$.0$^{2,7}$]dodecane vinyl ether, and a reaction was effected at 15° C. for 3 hours. The reaction was quenched by adding 18.0 g of aqueous ammonia (30%). This reaction solution was precipitated by crystallization by using 5 L of aqueous acetic acid. This precipitation was washed with water twice. Thus obtained white solid was filtered and dried under reduced pressure at 40° C. to obtain 163 g of a white polymer.

The obtained polymer was analyzed by $^{13}$C, $^1$H-NMR and GPC measurement, and the following results were obtained.

Copolymerization ratio (mole ratio) p1:q3:r=0.75:0.15:0.10

Mass-average molecular weight (Mw)=13,800

Molecular-weight distribution (Mw/Mn)=1.96

CLogP obtained from calculated value=3.21

This polymer is defined as poly-9.

poly-9

Synthetic Example 10

A 2 L flask reaction vessel was dried under reduced pressure. To this flask was added 1500 g of distilled and dehydrated tetrahydrofuran solution under nitrogen atmosphere, and the flask was cooled to −75° C. After that, 14.5 g of s-butyllithium (in cyclohexane solution: 1 N) was added thereto, and 140.5 g of 4-ethoxyethoxystyrene distilled and dehydrated with metallic sodium was further added dropwise. At this time, care was taken so that the inner temperature of the reaction solution did not exceed −65° C. The reaction was effected for 30 minutes, and then 10 g of methanol was added thereto to quenched the reaction. The reaction solution was allowed to warm to room temperature. Thus obtained reaction solution was concentrated under reduced pressure, and 800 g of methanol was added thereto and stirred. This solution was left at rest, and then an methanol layer, which was an upper layer, was removed. These procedures were repeated 3 times to remove metallic Li. A polymer solution, which was a lower layer, was concentrated. To this solution were added 840 mL of tetrahydrofuran, 630 mL of methanol and 3.2 g of oxalic acid. This solution was heated to 40° C. to effect a deprotection reaction for 20 hours. The solution was neutralized with 35 g of pyridine. The reaction solution was concentrated and dissolved in 0.6 L of acetone. This solution was precipitated in 7.0 L of water. This precipitation was washed to obtain a white solid. The white solid was filtered and then dried at 40° C. under reduced pressure to obtain 101 g of a white polymer (polyhydroxystyrene).

In a 2 L flask, 180 g of polyhydroxystyrene was dissolved in 1800 mL of tetrahydrofuran. To this solution were added 3.6 g of methansulfonic acid and 63.4 g of tricyclodecane vinyl ether, and a reaction was effected at 15° C. for 3 hours. The reaction was quenched by adding 18.0 g of aqueous ammonia (30%). This reaction solution was precipitated by crystallization by using 5 L of aqueous acetic acid. This precipitation was washed with water twice. Thus obtained white solid was filtered and dried under reduced pressure at 40° C. to obtain 222 g of a white polymer.

The obtained polymer was analyzed by $^{13}C$, $^1H$-NMR and GPC measurement, and the following results were obtained.
Copolymerization ratio (mole ratio) p1:q1=0.90:0.10
Mass-average molecular weight (Mw)=14,100
Molecular-weight distribution (Mw/Mn)=1.21
CLogP obtained from calculated value=2.84
This polymer is defined as poly-10.

poly-10

Synthetic Example 11

In a 2 L flask, 180.0 g of polyhydroxystyrene-indene copolymer (poly-1) was dissolved in 1800 mL of tetrahydrofuran. To this solution were added 3.6 g of methansulfonic acid and 51 g of ethylpropenyl ether, and a reaction was effected at 15° C. for 3 hours. The reaction was quenched by adding 18.0 g of aqueous ammonia (30%). This reaction solution was precipitated by crystallization by using 5 L of aqueous acetic acid. This precipitation was washed with water twice. Thus obtained white solid was filtered and dried under reduced pressure at 40° C. to obtain 199 g of a white polymer.

The obtained polymer was analyzed by $^{13}C$, $^1H$-NMR and GPC measurement, and the following results were obtained.
Copolymerization ratio (mole ratio) p1:v1:r=0.70:0.20:0.10
Mass-average molecular weight (Mw)=14,300
Molecular-weight distribution (Mw/Mn)=1.91
CLogP obtained from calculated value=2.83
This polymer is defined as poly-11.

poly-11

Synthetic Example 12

In a 2 L flask, 180.0 g of polyhydroxystyrene-indene copolymer (poly-2) was dissolved in 1800 mL of tetrahydrofuran. To this solution were added 3.6 g of methansulfonic acid and 39 g of 2-cyclohexylethylvinyl ether, and a reaction was effected at 15° C. for 3 hours. The reaction was quenched by adding 18.0 g of aqueous ammonia (30%). This reaction solution was precipitated by crystallization by using 5 L of aqueous acetic acid. This precipitation was washed with water twice. Thus obtained white solid was filtered and dried under reduced pressure at 40° C. to obtain 210 g of a white polymer.

The obtained polymer was analyzed by $^{13}C$, $^1H$-NMR and GPC measurement, and the following results were obtained.
Copolymerization ratio (mole ratio) p1:v2:r=0.78:0.07:0.15
Mass-average molecular weight (Mw)=10,200
Molecular-weight distribution (Mw/Mn)1.96
CLogP obtained from calculated value=2.84
This polymer is defined as poly-12.

poly-12

Examples, Comparative Examples

[Preparation of Positive Resist Composition]

The polymers synthesized above, acid generators represented by the following formulae, a basic compound, and a surfactant were dissolved into organic solvents in compositions shown in Tables 1 and 2 to prepare resist compositions.

Each composition in Tables 1 and 2 is as follows.

poly-4 to 12: obtained in Synthetic Examples 4 to 12

Acid Generators: PAG-1 and PAG-2 (refer to the following structural formulae)

PAG-1

PAG-2

Basic Compound: tris(2-methoxyethyl)amine
Surfactant: KH-20 (manufactured by Asahi Glass Co., Ltd.)
Organic solvent A: propylene glycol methyl ether acetate
Organic solvent B: ethyl lactate

TABLE 1

| Composition | Example 1 | Example 2 | Example 3 | Example 4 |
|---|---|---|---|---|
| poly-4 | 80 | — | — | — |
| poly-5 | — | 80 | — | — |
| poly-6 | — | — | 80 | — |
| poly-7 | — | — | — | 80 |
| PAG-1 | 6 | 6 | 6 | 6 |
| PAG-2 | 2 | 2 | 2 | 2 |
| Basic Compound | 0.2 | 0.2 | 0.2 | 0.2 |
| Surfactant | 0.07 | 0.07 | 0.07 | 0.07 |
| Organic solvent A | 470 | 470 | 470 | 470 |
| Organic solvent B | 1100 | 1100 | 1100 | 1100 |

TABLE 2

| Composition | Example 5 | Example 6 | Example 7 | Comparative Example 1 | Comparative Example 2 |
|---|---|---|---|---|---|
| poly-8 | 80 | — | — | — | — |
| poly-9 | — | 80 | — | — | — |
| poly-10 | — | — | 80 | — | — |
| poly-11 | — | — | — | 80 | — |
| poly-12 | — | — | — | — | 80 |
| PAG-1 | 6 | 6 | 6 | 6 | 6 |
| PAG-2 | 2 | 2 | 2 | 2 | 2 |
| Basic Compound | 0.2 | 0.2 | 0.2 | 0.2 | 0.2 |
| Surfactant | 0.07 | 0.07 | 0.07 | 0.07 | 0.07 |
| Organic solvent A | 470 | 470 | 470 | 470 | 470 |
| Organic solvent B | 1100 | 1100 | 1100 | 1100 | 1100 |

[Evaluation of Exposure Patterning]

Each of the resist compositions was filtered through a 0.04 μm nylon resin filter to prepare a resist solution. The resist solution was applied to a mask blank by spin-coating to form a 0.24 μm thick film.

Subsequently, the mask blank was baked on a hot plate at 90° C. for 10 minutes. Then the mask blank was exposed with an electron beam exposure system (HL-800D manufactured by Hitachi High-Technologies Corporation, acceleration voltage: 50 keV), baked at 110° C. for 10 minutes (PEB: post exposure bake), and developed with a 2.38% aqueous solution of tetramethylammonium hydroxide. As a result, positive patterns (Examples 1 to 7 and Comparative Examples 1 and 2) were obtained.

Thus obtained resist patterns were evaluated as follows.

An exposure dose that resolved the top and the bottom of 0.20 μm line and space in 1:1 was determined as an optimum exposure dose (sensitivity: Eop). A minimum linewidth of line and space isolated under the optimum exposure dose was determined as sensitivity of resist being evaluated. As for resolved resist pattern profiles, a scanning electron microscope was used to observe resist in cross-section.

The results are shown in Table 3 below.

In addition, the critical dimension (CD) of the space in 0.40 μm 1:1 line and space pattern was measured with a CD-SEM. This measurement was conducted at 49 points in the pattern formed on the substrate, and a maximum and a minimum among the obtained CD measurement values at 49 points were determined. The difference between thus obtained maximum and minimum was defined as a CD uniformity range. The smaller the value of the range (CD-U Range) is, the better in-plane dimension uniformity of a mask blank is.

The results are shown in Table 3 below.

[Evaluation of Dry Etching Resistance]

In dry etching resistance tests, resist patterns (Examples 1 to 7 and Comparative Examples 1 and 2) obtained by exposure and development as with above were etched with a TE8500S manufactured by Tokyo Electron, Ltd. under the following conditions.

Press: 40.0 Pa
RF Power: 800 W
Gas: 1) $CHF_3$ 20 sccm
2) $CF_4$ 20 sccm
3) Ar 400 sccm
Etching period: 2 minutes and 30 seconds Resist profiles after being etched were observed with a scanning electron microscope. The decrease of each film thickness by etching is shown in Table 3 below in relative ratio where the decrease of film thickness in Comparative Example 1 is defined as 1.0. The smaller the decrease is, the more excellent etching resistance the resist composition exhibits.

TABLE 3

| Comparative Examples and Examples | Resolution (μm) | Pattern Profile | CD-U Range | CLogP | Comparison of Etching Resistance (Comparison of decreases of film thicknesses) |
|---|---|---|---|---|---|
| Comparative Example 1 | 0.14 | somewhat rounded | 13.4 | 2.83 | 1 |
| Comparative Example 2 | 0.11 | pattern collapse | 13 | 2.84 | 0.89 |
| Example 1 | 0.07 | rectangle | 5.5 | 3.19 | 0.78 |
| Example 2 | 0.09 | rectangle | 12.8 | 2.88 | 0.71 |
| Example 3 | 0.08 | rectangle | 7.7 | 3 | 0.74 |
| Example 4 | 0.08 | rectangle | 4.9 | 3.27 | 0.78 |
| Example 5 | 0.1 | rectangle | 10.5 | 2.96 | 0.7 |
| Example 6 | 0.08 | rectangle | 5.3 | 3.21 | 0.77 |
| Example 7 | 0.08 | somewhat rounded | 12.5 | 2.84 | 0.92 |

From the results in FIG. 3, it has been established that resist compositions according to the present invention (Examples 1 to 7) exhibit higher resolution than the resist compositions of Comparative Examples 1 and 2, good in-plane dimension uniformity of developed resist patterns on mask blanks, and high etching resistance.

The present invention is not limited to the above-described embodiments. The above-described embodiments are mere examples, and those having the substantially same structure as that described in the appended claims and providing the similar action and advantages are included in the scope of the present invention.

The invention claimed is:

1. A polymer at least comprising repeating units represented by the following general formulae (1) and (2), and the polymer having a mass average molecular weight of 1,000 to 500,000, wherein $R_1$ and $R_2$ independently represent a hydrogen atom or a methyl group;

$R_3$ represents any one of a hydroxy group, a linear or branched alkyl group, a halogen atom, and a trifluoromethyl group;

$R_4$ represents a hydrogen atom or a $C_{1-10}$ linear, branched or cyclic alkyl group;

Z represents a $C_{7-30}$ aliphatic polycyclic alkyl group;

t is a positive integer of from 1 to 5;

u is 0 or a positive integer of from 1 to 4; and p and q are positive numbers.

2. The polymer according to claim 1, further comprising a repeating unit represented by the following formula (3), wherein r is a positive number.

3. The polymer according to claim 1, further comprising a repeating unit represented by the following formula (4), wherein s is a positive number.

4. The polymer according to claim 1, wherein the Z, which represents a $C_{7-30}$ aliphatic polycyclic alkyl group, is represented by any one of the following formulae (5), (6) and (7), 5. The polymer according to claim 2, wherein the Z, which represents a $C_{7-30}$ aliphatic polycyclic alkyl group, is represented by any one of the following formulae (5), (6) and (7), (5)

(6)

(7)

6. The polymer according to claim 3, wherein the Z, which represents a $C_{7-30}$ aliphatic polycyclic alkyl group, is represented by any one of the following formulae (5), (6) and (7), (5)

(6)

(7)

7. The polymer according to claim 1, having a CLogP value not less than 2.9, the value being a calculated value of a hydrophobic parameter.

8. The polymer according to claim 2, having a CLogP value not less than 2.9, the value being a calculated value of a hydrophobic parameter.

9. The polymer according to claim 3, having a CLogP value not less than 2.9, the value being a calculated value of a hydrophobic parameter.

10. The polymer according to claim 4, having a CLogP value not less than 2.9, the value being a calculated value of a hydrophobic parameter.

11. The polymer according to claim 5, having a CLogP value not less than 2.9, the value being a calculated value of a hydrophobic parameter.

12. The polymer according to claim 6, having a CLogP value not less than 2.9, the value being a calculated value of a hydrophobic parameter.

13. The polymer according to claim 1, having a CLogP value not less than 3.0, the value being a calculated value of a hydrophobic parameter.

14. The polymer according to claim 2, having a CLogP value not less than 3.0, the value being a calculated value of a hydrophobic parameter.

15. The polymer according to claim 3, having a CLogP value not less than 3.0, the value being a calculated value of a hydrophobic parameter.

16. The polymer according to claim 4, having a CLogP value not less than 3.0, the value being a calculated value of a hydrophobic parameter.

17. The polymer according to claim 5, having a CLogP value not less than 3.0, the value being a calculated value of a hydrophobic parameter.

18. The polymer according to claim 6, having a CLogP value not less than 3.0, the value being a calculated value of a hydrophobic parameter.

19. A resist composition at least comprising the polymer according to claim 1.

20. A chemically amplified positive resist composition at least comprising an organic solvent, the polymer according to claim 1 as a base resin, and an acid generator.

21. The chemically amplified positive resist composition according to claim 20, further comprising a surfactant.

22. The chemically amplified positive resist composition according to claim 20, further comprising a basic compound.

23. A patterning process comprising: at least, a step of applying the resist composition according to claim 19 on a substrate; a step of conducting a heat-treatment and then exposing the substrate to a high energy beam; and a step of developing the substrate with a developer.

* * * * *